United States Patent [19]
Makhija

[11] Patent Number: 5,834,939
[45] Date of Patent: Nov. 10, 1998

[54] HAND-HELD IGNITION VOLTAGE TESTER

[76] Inventor: Surender K. Makhija, 4580 Sommerset La., Brookfield, Wis. 53045

[21] Appl. No.: 729,754

[22] Filed: Oct. 7, 1996

[51] Int. Cl.⁶ .................................................. G01R 15/04
[52] U.S. Cl. .......................... 324/402; 324/393; 324/379; 324/72.5
[58] Field of Search ................... 324/402, 126, 324/393, 72.5, 379

[56] References Cited

U.S. PATENT DOCUMENTS

| | | | |
|---|---|---|---|
| 3,763,421 | 10/1973 | Glomski | 324/402 |
| 4,052,665 | 10/1977 | Gruenwald | 324/126 |
| 4,090,130 | 5/1978 | Willenbecher | 324/126 |
| 4,942,362 | 7/1990 | Lance | 324/402 |
| 5,132,625 | 7/1992 | Shaland | 324/402 |
| 5,399,972 | 3/1995 | Hnat | 324/402 |
| 5,497,092 | 3/1996 | Kaszanics | 324/402 |
| 5,612,620 | 3/1997 | Heuvel | 324/402 |

*Primary Examiner*—Josie Ballato
*Assistant Examiner*—Jose M. Solis
*Attorney, Agent, or Firm*—Westman, Champlin & Kelly, P.A.

[57] ABSTRACT

A hand-held ignition voltage tester for detecting voltage on a spark plug wire in an ignition system, such as a distributorless ignition system. The tester includes a housing, positive and negative power cables and a capacitive probe for capacitively coupling to the spark plug wire. The capacitive probe generates a voltage signal which is representative of the voltage on the spark plug wire. A plurality of voltage level indicators are mounted to the housing to form a bar graph, with each indicator corresponding to a selected voltage level. A measurement circuit is coupled to the power cables and the capacitive probe for activating the voltage level indicators in response to the voltage signal.

19 Claims, 5 Drawing Sheets

HAND-HELD IGNITION VOLTAGE TESTER

BACKGROUND OF THE INVENTION

The present invention relates to automotive test equipment and, in particular, to a hand-held ignition voltage tester for detecting a secondary voltage in a spark plug wire.

The majority of automobiles manufactured today use distributorless ignition systems similar to the systems that have been used on multi-cylinder motorcycle engines. Distributorless ignition systems use multiple ignition coils, with each coil having two secondary outputs connected in a series with one another. The two secondary outputs are connected to the spark plugs of a pair of companion cylinders, and both spark plugs fire simultaneously but with opposite polarities. A four cylinder engine uses two ignition coils and a six cylinder engine uses three ignition coils. In a four stroke engine, one spark plug fires during the compression stroke and the other spark plug fires during the exhaust stroke. Therefore, each spark plug fires twice every engine cycle. The spark plug firing that occurs during the compression stroke is called a "useful" firing and the firing that occurs during the exhaust stroke is called a "waste" firing. The secondary voltage required by a spark plug during a compression firing is much higher than the voltage required during an exhaust firing.

Most present day ignition voltage testers use multiple secondary probes which are connected to each spark plug wire. Each probe has an assigned polarity, either positive or negative. The operator is required to know the firing voltage polarity of each spark plug wire for a give engine to be able to connect the probes to the correct spark plug wires. This significantly increases the time required for the test since the operator must first look up the firing voltage polarity for each engine tested. This also increases the level skill required to properly test the ignition voltage.

Another disadvantage of most present day ignition voltage testers is that they use expensive displays to display the peak ignition voltages graphically. These displays include a cathode ray tube (CRT) or an LCD graphic display, for example. Also, these displays require complex circuitry to obtain the entire secondary waveforms, measure the peak ignition voltages and drive the displays, which further increases the cost of the tester. The displayed waveforms require a skilled mechanic to read and properly interpret the data.

Yet another disadvantage of most present day testers is that the probes used to pick up the secondary voltages lack sufficient isolation. A typical probe includes a metallic spring-loaded, alligator-type clamp. The metallic frame of the clamp itself is used as the pickup. A clamp of this type picks up stray signals from adjacent spark plug wires. The clamp must therefore be moved sufficiently far away from adjacent spark plug wires, if possible, to obtain a proper reading.

SUMMARY OF THE INVENTION

The hand-held ignition voltage tester of the present invention is inexpensive, provides an easy to read output and is simple to use in that it requires no knowledge of spark plug polarity and resists stray pickups from adjacent spark plug wires. The tester includes a housing, positive and negative power cables and a capacitive probe for capacitively coupling to a spark plug wire. The capacitive probe generates a voltage signal which is representative of the voltage on the spark plug wire. A plurality of voltage level indicators are mounted to the housing, with each indicator corresponding to a selected voltage level. A measurement circuit is coupled to the power cables and the capacitive probe for selectively activating the voltage level indicators in response to the voltage signal. The measurement circuit activates each voltage level indicator for which the voltage signal exceeds the corresponding selected voltage level.

In one embodiment, the tester further includes an absolute value circuit and a plurality of comparators. The absolute value circuit has an input coupled to the capacitive probe and has a magnitude output. Each comparator has a first input coupled to the magnitude output, a second input coupled to a respective reference voltage and an output coupled to a respective one of the plurality of voltage level indicators.

The voltage level indicators are preferably arranged on the housing in a line to form a bar graph. In one embodiment, the tester further includes a low voltage indicator at a low end of the bar graph which is activated to indicate a low voltage condition when the magnitude output is less than a selected minimum voltage level. An open circuit indicator is positioned at a high end of the bar graph and is operated by the measurement circuit to indicate an open circuit condition when the voltage signal exceeds a selected maximum voltage.

In a preferred embodiment, the capacitive probe includes a conductive probe handle and a clamping member for clamping to the spark plug wire. A first insulator is attached to the clamping member, which insulates the clamping member from the spark plug wire. A shielded cable extends from the housing and is attached to the probe handle. The shielded cable includes an inner conductor, a second insulator surrounding the inner conductor, a conductive shield surrounding the second insulator, and a third insulator surrounding the conductive shield. The probe handle is grounded to the conductive shield. The inner conductor extends along the clamping member between the clamping member and the first insulator to form a capacitive pick up. The conductive shield is stripped from the inner conductor along the clamping member only.

DETAILED DESCRIPTION OF THE PREFERRED EMBODIMENTS

Figure 1:
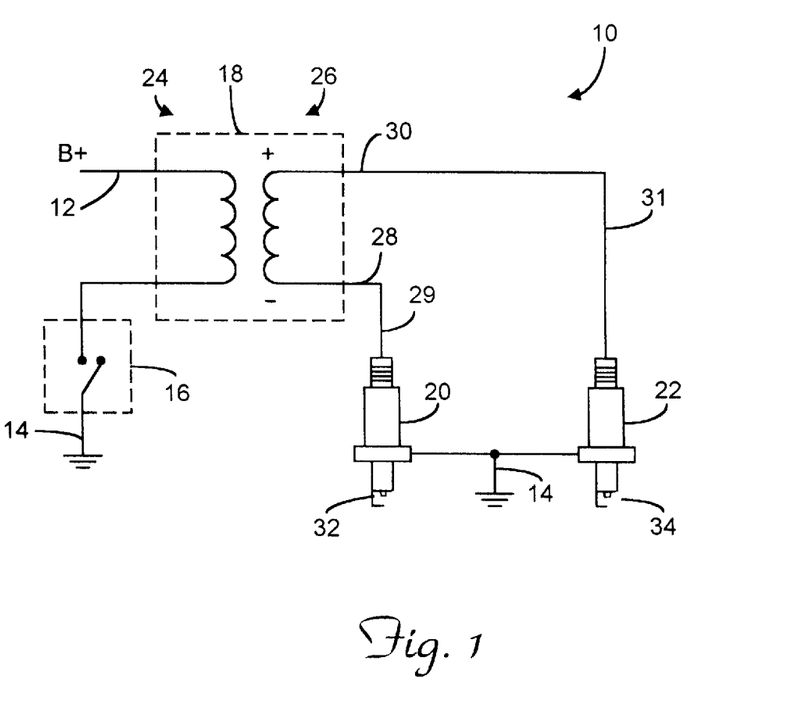
FIG. 1 is a simplified schematic diagram of a distributorless ignition system.

FIG. 1 is a simplified schematic diagram of a distributorless ignition system. Ignition system 10 includes positive terminal 12, ground terminal 14, switch 16, ignition coil 18 and spark plugs 20 and 22. Ignition coil 18 has a primary side 24 which is coupled in series between positive terminal 12 and ground terminal 14, through switch 16. Ignition coil 18 has a secondary side 26 with a pair of secondary outputs 28 and 30. Output 28 is coupled to spark plug 20 through spark plug wire 29, and output 30 is coupled to spark plug 22 through spark plug wire 31. Spark plugs 20 and 22 are coupled to ground terminal 14, through gaps 32 and 34.

Spark plugs 20 and 22 are mounted within a pair of companion cylinders (not shown) and fire simultaneously with opposite polarities. Switch 16 is opened and closed to create a change in current in primary side 24 of ignition coil 18, which results in a large secondary voltage developed in secondary side 26. The secondary voltage increases until the charge developed on spark plugs 20 and 22 discharges across gaps 32 and 34. The secondary voltage at which spark plugs 20 and 22 fire depends upon the resistance of spark plug wires 29 and 31, the width of gaps 32 and 34 and the condition of the spark plug electrodes. Therefore, ignition performance can be determined by observing the secondary voltages developed on each of the spark plug wires on the engine.

Figure 2:
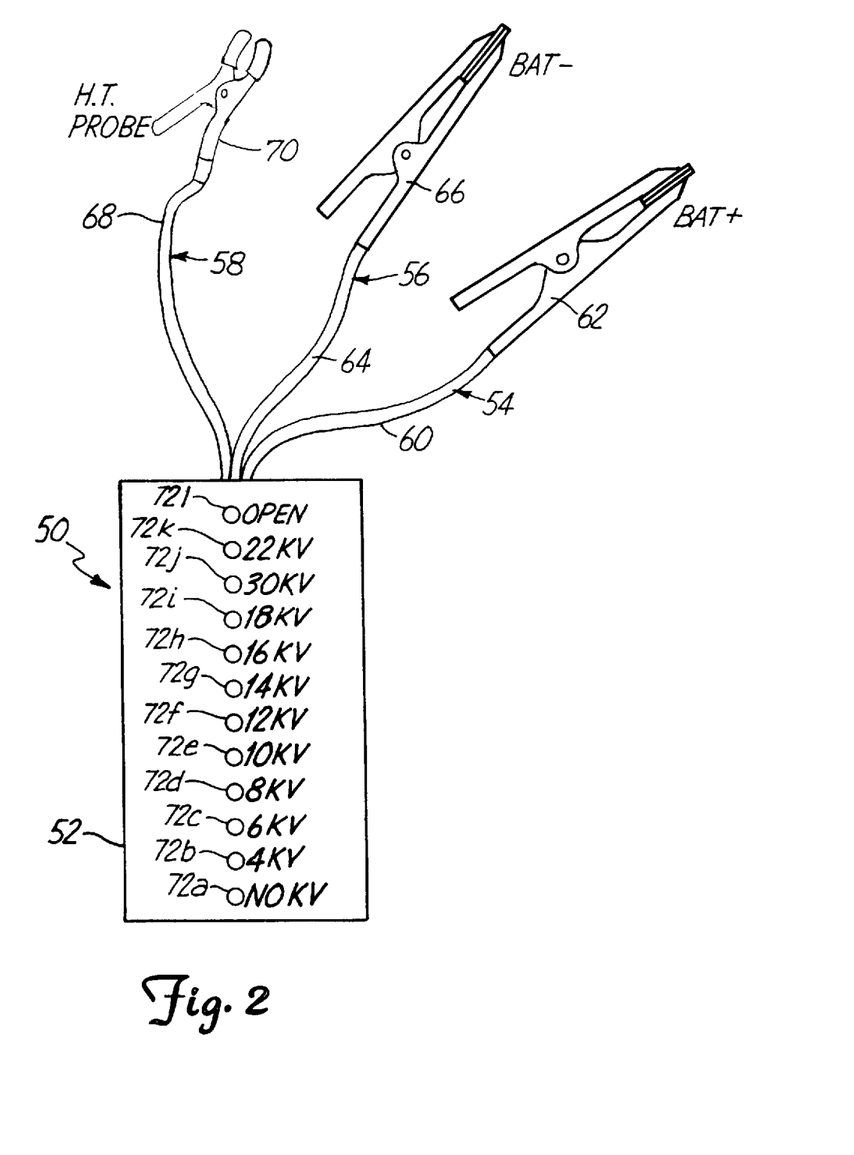
FIG. 2 is a top plan view of a hand-held ignition voltage tester according to the present invention.

FIG. 2 is a top plan view of an ignition voltage tester in accordance with the present invention. Tester 50 includes housing 52, positive battery cable 54, negative battery cable 56 and high tension (H.T.) probe 58. Positive battery cable 54 includes conductor 60 and clamp 62. Negative battery cable 56 includes conductor 64 and clamp 66. Positive and negative battery cables 54 and 56 provide power to tester 50. Probe 58 includes shielded cable 68 and capacitive pickup 70. Capacitive pick-up 70 is attached to a spark plug wire, such as wire 29 shown in FIG. 1, for generating a measurement signal indicative of the voltage on the spark plug wire. Probe 58 is discussed in greater detail below with reference to FIGS. 4 and 5.

A plurality of voltage level indicators 72a–72l are mounted to housing 52 in a line to form a bar graph. In preferred embodiment, voltage level indicators 72a–72l each include a light emitting diode (LED) which corresponds to a selected secondary voltage level. For example, indicators 72b–72k correspond to 4, 6, 8, 10, 12, 14, 16, 18, 20 and 22 KV, respectively. Indicator 72a corresponds to a voltage of less than 4 KV, and indicator 72l corresponds to a voltage level of greater than 24 KV. Tester 50 activates each indicator 72b–72l for which the measurement signal exceeds the corresponding secondary voltage level. For example, if the measurement voltage represented a secondary voltage level of 15 KV, indicators 72b–72g would be lit.

Indicator 72a is a low-voltage indicator which lights to indicate a low-voltage condition when the measurement voltage represents a secondary voltage of less than 4 KV. Indicator 72l is an open circuit indicator which lights when the measurement signal represents a secondary voltage that exceeds a maximum voltage level, such as 24 KV. Preferably, indicators 72a and 72l are a different color than indicators 72b–72k. For example, indicators 72a and 72l may be red, while indicators 72b–72k may be green. The red indicators would indicate a failure condition.

Figure 3A:
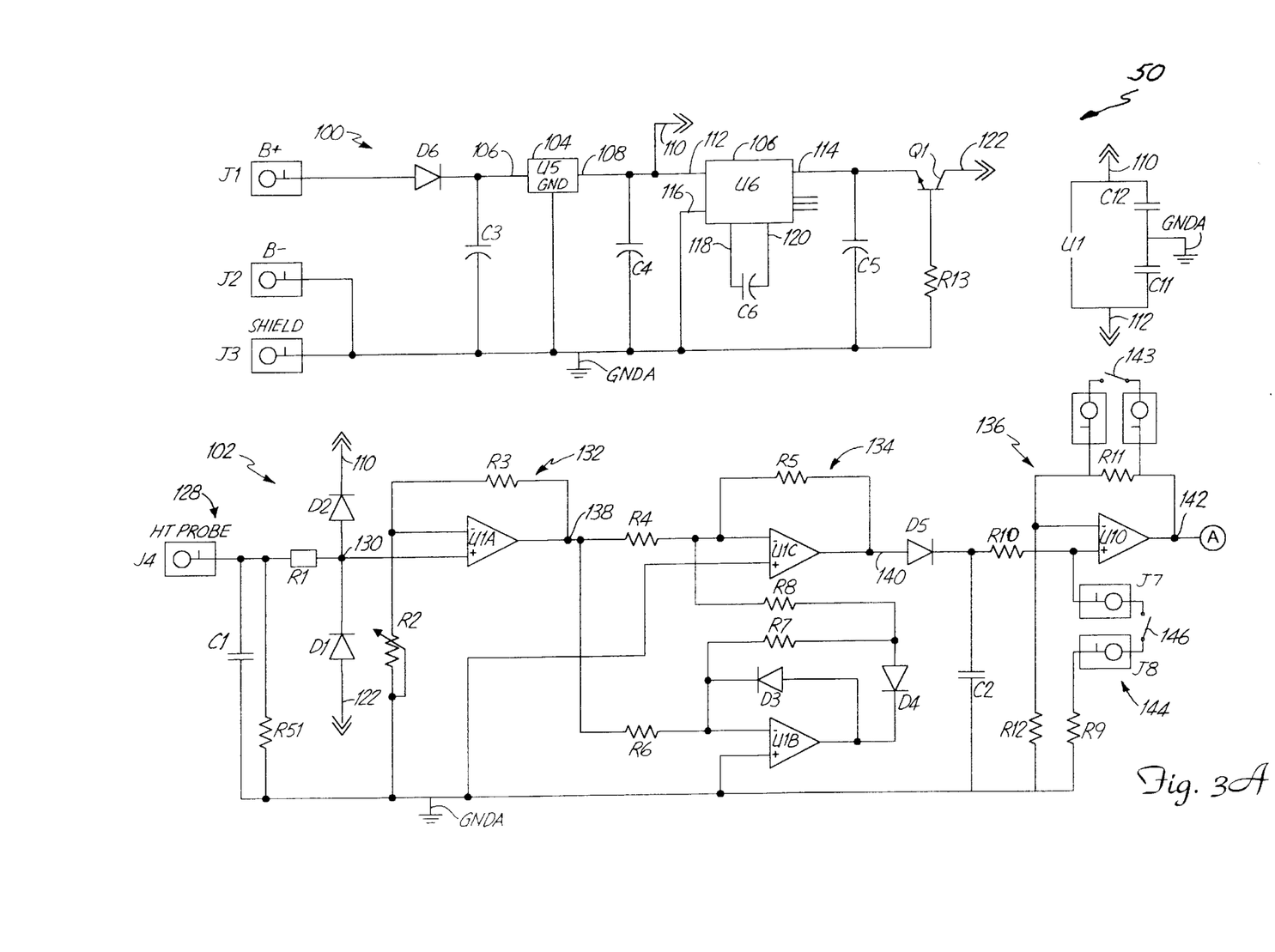
FIGS. 3a and 3b are schematic diagrams of the tester shown in FIG. 2.
Figure 3B:
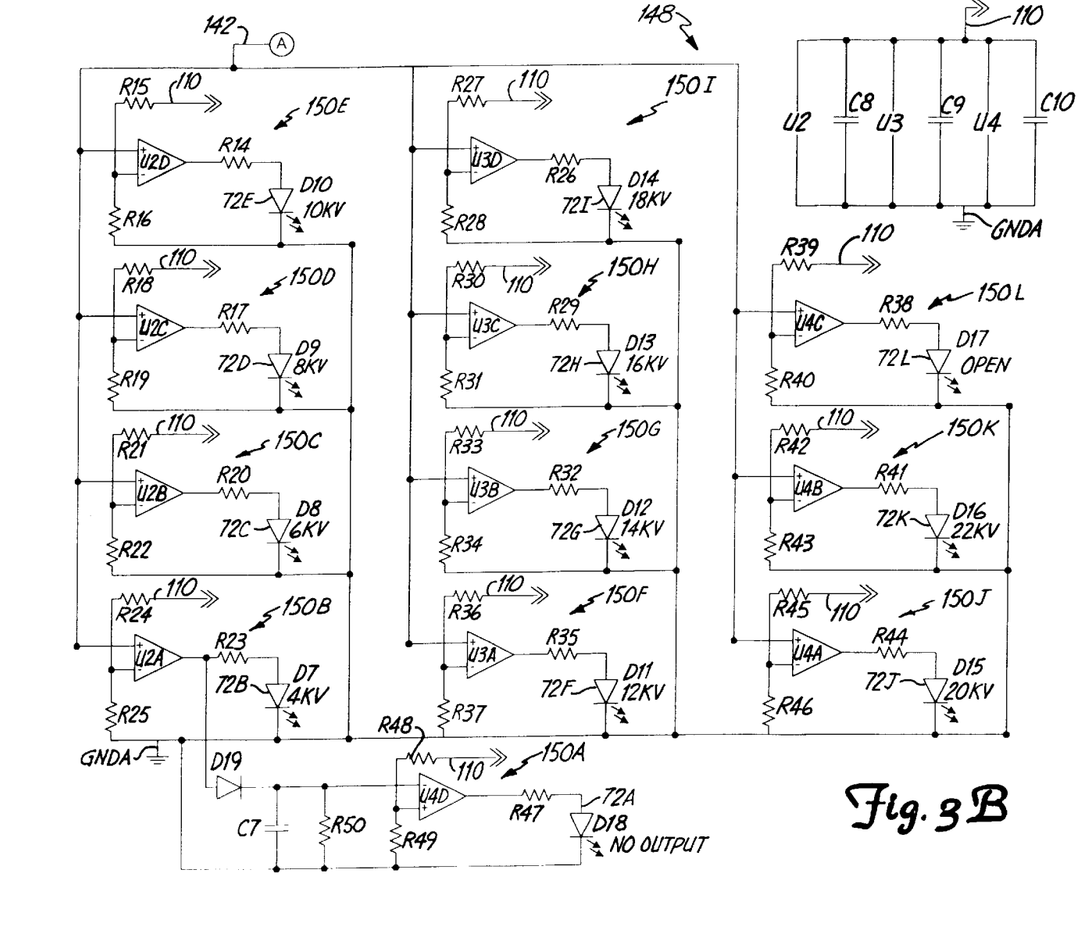

FIGS. 3a and 3b together form a schematic diagram of tester 50. As shown in FIG. 3a, tester 50 includes a power supply circuit 100 and an input circuit 102. Power supply circuit 100 includes inputs J1, J2 and J3, diode D6, capacitors C3, C4, C5 and C6, resistor R13, voltage regulator 104, DC-to-DC converter 106 and transistor Q1. Inputs J1, J2 and J3 are coupled to battery positive cable 54, battery negative cable 56 and probe 58, respectively. Inputs J2 and J3 are further coupled to ground terminal GNDA of tester 50. Diode D6 is a reverse voltage protection diode having an anode coupled to input J1 and a cathode coupled to input 108 of voltage regulator 104. Capacitor C3 is a filter capacitor which is coupled between the cathode of diode D6 and ground terminal GNDA. Voltage regulator 104 further includes a ground terminal GND which is coupled to ground terminal GNDA and an output 108 which is coupled to positive 9-volt supply terminal 110. Capacitor C4 is coupled between output 108 and ground terminal GNDA. Voltage regulator 104 includes an LM2940T regulator, for example, which is available from National Semiconductor Corporation.

DC-to-DC converter 106 has an input 112 which is coupled to positive 9-volt supply terminal 110. DC-to-DC converter 106 inverts the voltage received on input 112 and thus supplies −9 volts on output 114. Converter 106 further includes a ground terminal 116 which is coupled to ground terminal GNDA. Capacitor C6 is coupled across inputs 118 and 120 of converter 106. Converter 106 includes a National Semiconductor LT1054 DC-to-DC converter, for example. Capacitor C5 is coupled between output 114 and ground terminal GNDA. Resistor R13 is coupled between the base of transistor Q1 and ground terminal GNDA. The emitter of transistor Q1 is coupled to output 114, and the collector of transistor Q1 is coupled to negative 9-volt supply terminal 122. Supply terminals 110 and 122 supply power to the various elements of tester 50.

Input circuit 102 includes capacitive divider 128, variable gain amplifier 132, absolute value circuit 134, measurement capacitor C2 and range amplifier 136. Input J4 is coupled to probe 58 (shown in FIG. 1). Capacitive divider 12 and 13 formed by the capacitive pick-up of probe 58 and capacitor C1, which are coupled in series, with capacitor C1 being coupled between input J4 and ground terminal GNDA. Resistor R51 is coupled in parallel with capacitor C1. Capacitor C1 and probe 58 generate a voltage on input J4 that is representative the secondary voltage of the spark plug to which the probe is clamped. Resistor R1 is coupled between input J4 and node 130. Protection diodes D1 and D2 are coupled between node 130 and supply terminals 122 and 110, respectively.

Variable gain amplifier 132 includes operational amplifier U1A, variable resistor R2 and resistor R3. Resistor R2 is coupled between the inverting input of amplifier U1A and ground terminal GNDA. The non-inverting input of amplifier U1A is coupled to node 130. Resistor R3 is coupled between the output of amplifier U1A and the inverting input of amplifier U1A. The resistance of resistor R2 may be adjusted to adjust the gain of amplifier 132 and thereby calibrate tester 50 to changes in the capacitance or resistance of the particular probe that is used with tester 50.

Absolute value circuit 134 includes operational amplifiers U1B and U1C, diodes D3 and D4 and resistors R4–R8. Absolute value circuit 134 has an input 138 which is coupled to the output of amplifier U1A and a magnitude output 140 which is coupled to the anode of Schottky diode D5. Absolute value circuit 134 receives positive or negative voltages on input 138 and supplies a positive output voltage on output 140 which is proportional to the absolute value of the magnitude of the input voltage on input 138. Diodes D3 and D4 allow only positive voltages to pass through amplifier U1B, while both positive and negative voltages pass through amplifier U1C. Amplifier U1B operates as inverting amplifier having unity gain, the output of which is added to the inverting input of amplifier U1C. Resistor R8 has one-half of the resistance of resistor R5. Amplifier U1C therefore operates as an inverting amplifier having a gain of two for the output of amplifier U1B. Negative voltages are inverted through amplifier U1C with unity gain. Thus, the voltage resulting on output 140 is positive and has a unity gain for both positive and negative input voltages. Absolute value circuit 134 is an example of an absolute value circuit that is useful with the present invention. Other absolute value circuits can also be used. In a preferred embodiment, absolute value circuit 134 has unity gain.

Schottky diode D5 is coupled between magnitude output 140 of absolute value circuit 134 and measurement capacitor C2. A Shottky diode is preferred since it is relatively fast and will quickly charge measurement capacitor C2. The charge on measurement capacitor C2 is proportional to the secondary voltage on the spark plug to which probe 58 is attached. Range amplifier 136 receives a voltage representative of the charge on capacitor C2 and provides an output voltage on node 142. Range amplifier 136 includes operational amplifier U1D and resistors R10, R11 and R12. Resistor R10 is coupled between measurement capacitor C2 and the non-inverting input of amplifier U1D. Resistor R11 is coupled in a feedback loop between output 142 and the inverting input of amplifier U1D. A range selector switch 143 is coupled across resistor R11 through inputs J5 and J6. Switch 143 is normally closed such that range amplifier 136 has unity gain. When range switch 143 is open, resistor R11 is no longer shorted and the gain of range amplifier 136 increases by a factor determined by the resistance of resistor R11. In this embodiment, the gain doubles. When the gain is doubled, voltage level indicators 72$b$–72$k$ correspond to 4–12 KV instead of 4–22 KV. This provides increased resolution for low secondary voltages.

Input circuit 102 further includes peak store circuit 144 which includes inputs J7 and J8, switch 146 and resistor R9. Inputs J7 and J8 are coupled together in series with resistor R9 between the non-inverting input of amplifier U1D and ground terminal GNDA. Switch 146 is coupled across inputs J7 and J8. In a normal mode, switch 146 is in a closed state such that capacitor C2 continually discharges through resistor R9. In a peak store mode, switch 146 is in an open state. The peak voltages are no longer discharged through resistor R9 but are stored on capacitor C2. These peak voltages can then be observed on indicators 72$a$–72$l$ (shown in FIG. 2).

Operational amplifiers U1A, U1B, U1C and U1D are preferably implemented on the same integrated circuit, such as a TL074 integrated circuit available from Texas Instruments Incorporated. Integrated circuit U1 is shown in the upper right hand corner of FIG. 3$a$ and is coupled between supply terminals 110 and 112. A pair of bypass capacitors C11 and C12 are coupled in series across integrated circuit U1. Ground terminal GNDA is coupled to a node between capacitors C11 and C12.

Referring to FIG. 3$b$, tester 50 further includes measurement circuit 148 which is formed of a plurality of comparator circuits 150$b$–150$l$. Each comparator circuit 150$b$–150$l$ has an operational amplifier with a non-inverting input coupled to output 142 of range amplifier 136, an inverting input coupled to a respective reference voltage and an output coupled to a respective voltage level indicator 72$b$–72$l$. In the embodiment shown in FIG. 3$b$, indicators 72$b$–72$l$ include LEDs D7–D17, respectively.

For example, comparator circuit 150$b$ includes operational amplifier U2A and resistors R23–R25. The non-inverting input of operational amplifier U2A is coupled to output 142 of range amplifier 136. Resistors R24 and R25 are coupled together in series between supply terminal 110 and ground terminal GNDA to form a voltage divider at the inverting input of operational amplifier U2A. The output of operational amplifier U2A is coupled to LED D7 through resistor R23. The voltage divider formed by resistor R24 and R25 generates a reference voltage at the inverting input of amplifier U2A which is representative of a selected secondary voltage level, such as 4 KV. The reference voltage level is selected by adjusting the resistances of resistors R24 and R25. If the voltage on output 142 is greater than the reference voltage at the inverting input of amplifier U2A, the output of amplifier U2A goes high, which turns on LED D7. If the voltage on output 142 is less than the reference voltage at inverting input of amplifier U2A, the output of amplifier U2A goes low, which turns off LED D7.

Each comparator circuit 150$b$–150$l$ has a progressively larger reference voltage level such that LEDs D7–D17 form a bar graph which illustrates the instantaneous secondary voltage in the spark plug wire being tested.

Comparator circuit 150$l$ has the largest reference voltage level, and its associated voltage level indicator 150$l$ is positioned at a high end of the bar graph. The reference voltage level of comparator circuit 150$l$ represents a selected maximum secondary voltage. If the voltage on output 142 exceeds the selected maximum voltage, comparator circuit 150$l$ turns on LED D17 to indicate an open circuit condition, such as an open spark plug wire or a faulty spark plug.

Measurement circuit 100 further includes a short or low voltage indicator circuit 150$a$. Low voltage indicator circuit 150$a$ is a comparator circuit similar to comparator circuits 150$b$–150$l$, but is coupled to the output of operational amplifier U2A and has a time delay. Circuit 150$a$ includes diode D19, capacitor C7, resistors R47–R50, operational amplifier U4D and voltage level indicator 72$a$. Diode D19 is coupled between the output of operational amplifier U2A and the inverting input of operational amplifier U4D. Capacitor C7 and resistor R50 are coupled together in parallel between the inverting input of operational amplifier U4D and ground terminal GNDA. Resistors R48 and R49 are coupled together in series between supply terminal 110 and ground terminal GNDA to form a voltage divider at the non-inverting input of operational amplifier U4D. The output of operational amplifier U4D is coupled to voltage level indicator 72$a$ through resistor R47. Indicator 72$a$ is formed by LED D18.

If the voltage on output 142 is greater than the reference voltage at the inverting input of operational amplifier U2A (i.e., the secondary voltage on the spark plug wire is greater than 4 KV), the output of operational amplifier U2A will be high. This charges capacitor C7, which holds the output of operational amplifier U4D low and holds LED D18 off. If the output of operational amplifier U2A goes low for a short period of time, such as with a misfire of the ignition system, capacitor C7 will remain charged holding LED D18 off. However, if the output of operational amplifier U2A stays low for a selected time period such as 1–2 seconds (i.e., the secondary voltage on the spark plug wire is less than 4 KV) the capacitor C7 discharges through resistor R50 allowing LED D18 to turn on indicating a low voltage condition. The selected time period is determined by the capacitance of capacitor C7 and the resistance of resistor R50. A low voltage condition may be caused by a faulty ignition system, a shorted spark plug wire or a shorted spark plug.

Operational amplifiers U2A–U2D, U3A–U3D and U4A–U4D are implemented in integrated circuits U2, U3 and U4, which are shown in the upper right hand corner of FIG. 3$b$. Integrated circuits can include LM324N type integrated circuits, for example, which are available from National Semiconductor Corporation. Integrated circuits U2, U3 and U4 are coupled between supply terminal 110 and ground terminal GNDA. Bypass capacitors C8, C9 and C10 are coupled across integrated circuits U2, U3 and U4.

The following table provides examples of component values which can be used in the circuit shown in FIGS. 3$a$ and 3$b$. These values are provided as an example only.

| Element | Value |
| --- | --- |
| R1 | 10 KΩ |
| R2 | 10 KΩ |
| R3 | 10 KΩ |

-continued

| Element | Value |
| --- | --- |
| R4 | 10 KΩ |
| R5 | 10 KΩ |
| R6 | 10 KΩ |
| R7 | 10 KΩ |
| R8 | 5.1 KΩ |
| R9 | 2 MΩ |
| R10 | 2 KΩ |
| R11 | 10 KΩ |
| R12 | 10 KΩ |
| R13 | 2 KΩ |
| R14 | 800 Ω |
| R15 | 10 KΩ |
| R16 | 2.9 KΩ |
| R17 | 800 Ω |
| R18 | 10 KΩ |
| R19 | 2 KΩ |
| R20 | 800 Ω |
| R21 | 10 KΩ |
| R22 | 1.2Ω |
| R23 | 800 Ω |
| R24 | 10 KΩ |
| R25 | 590 Ω |
| R26 | 800 Ω |
| R27 | 10 KΩ |
| R28 | 8 KΩ |
| R29 | 800 Ω |
| R30 | 10 KΩ |
| R31 | 6.4 KΩ |
| R32 | 800 Ω |
| R33 | 10 KΩ |
| R34 | 5 KΩ |
| R35 | 800 Ω |
| R36 | 10 KΩ |
| R37 | 3.8 KΩ |
| R38 | 800 Ω |
| R39 | 10 KΩ |
| R40 | 16 KΩ |
| R41 | 800 Ω |
| R42 | 10 KΩ |
| R43 | 12.5 KΩ |
| R44 | 800 Ω |
| R45 | 10 KΩ |
| R46 | 10 KΩ |
| R47 | 800 Ω |
| R48 | 10 KΩ |
| R49 | 10 KΩ |
| R50 | 20 MΩ |
| R51 | 200 KΩ |
| C1 | 1000 pf |
| C2 | 0.1 µf |
| C3 | 1 µf |
| C4 | 2 µf |
| C5 | 10 µf |
| C6 | 10 µf |
| C7 | 0.1 µf |
| C8 | 0.1 µf |
| C9 | 0.1 µf |
| C10 | 0.1 µf |
| C11 | 0.1 µf |
| C12 | 0.1 µf |

Figure 4:
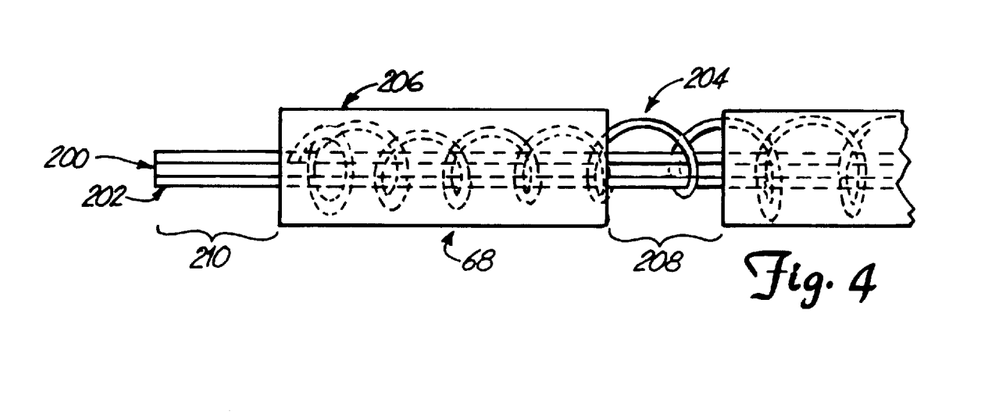
FIG. 4 is a detailed view of a shielded cable used in the tester shown in FIG. 1.
Figure 5:
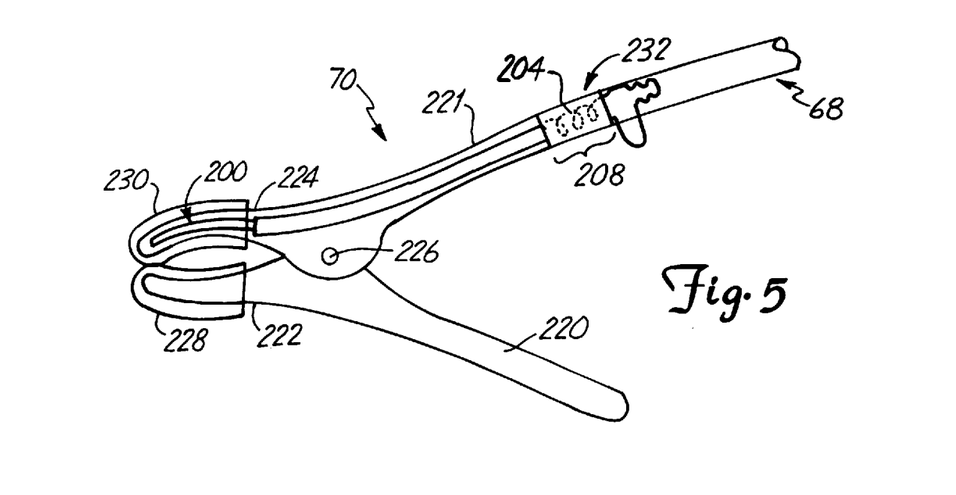
FIG. 5 is a plan view of a capacitive probe coupled to the shielded cable, in accordance with the present invention.

FIGS. 4 and 5 illustrate probe 58 shown in FIG. 2 in greater detail. FIG. 4 is a side plan view of shielded cable 68, which extends between tester 50 and capacitive pickup 70. Shielded cable 68 includes inner conductor 200, inner conductor insulator 202, braided conductive shield 204 and outer insulating jacket 206. As shown in FIG. 4, the distal end of cable 68 has a portion 208 at which outer jacket 206 is stripped expose braided shield 204 and has a portion 210 at which both outer jacket 206 and braided shield 204 are stripped to expose inner conductor 200 and inner conductor insulator 204.

FIG. 5 is a side plan view of cable 68 attached to capacitive pickup 70. In the embodiment shown in FIG. 5, capacitive pickup 70 includes a metallic, spring-loaded, alligator-type clamp having a pair of handles 220 and 221 and a pair of clamping teeth 222 and 224, which are separated by a pivot 226. Handles 220 and 221 are pressed together to separate clamping teeth 222 and 224 when connecting pickup 70 to a respective spark plug wire. Rubber boots 228 and 230 are attached to surround clamping teeth 222 and 224 for insulating teeth 222 and 224 from the spark plug wire to which pickup 70 is connected. Boots 228 and 230 can be attached to teeth 222 and 224 by a silicon glue, for example.

Shielded cable 68 is attached to and extends along handle 221. Handle 221 includes a metallic crimp 232 which is positioned adjacent portion 208 at which conductive shield 204 is exposed. Crimp 232 is crimped onto conductive shield 204 to attach cable 68 to handle 221 and to ground handle 221 to conductive shield 204. The distal end of cable 68 extends along clamping tooth 224, between the clamping tooth and rubber boot 230. Outer jacket 206 and conductive shield 204 are stripped from inner conductor 200 and inner conductor insulator 210 along clamping tooth 224 only. This shields inner conductor 200 along the entire length of cable 68, accept within rubber boot 230.

The unshielded portion of inner conductor 200 within boot 230 forms the actual high voltage capacitive pickup. The clamp itself is grounded and forms no part of the capacitive pickup. With this structure, no stray capacitances are picked up through the clamp or through cable 68 from adjacent spark plug wires. The clamp or the cable 68 can rest on adjacent spark plug wires without causing interference in the readings of tester 50. This makes tester 70 much easier to use and significantly increases the integrity of the readings. In an alternative embodiment, the clamp includes a T-type connector, as opposed to an alligator-type connector.

The ignition voltage tester of the present invention provides a low-cost, easy to use approach for making secondary voltage measurements in an ignition system. The tester can be used with distributorless or conventional ignition systems. In a distributorless ignition system, the operator is not required to know the polarity of each spark plug before taking the reading. A positive voltage reading is made regardless of the polarity of the spark plug. The LED display provides a low cost, simple visual display of the readings which identifies the peak secondary voltage and identifies short circuit and open circuit conditions. The entire tester requires a small number of very inexpensive components, which reduces the cost of the tester.

Although the present invention has been described with reference to preferred embodiments, workers skilled in the art will recognize that changes may be made in form and detail without departing from the spirit and scope of the invention.

What is claimed is:

1. A hand-held ignition voltage tester for detecting voltage on a spark plug wire in a distributorless ignition system, the tester comprising:

a housing;

a positive and negative power cables for coupling power to the tester;

a capacitive probe for capacitively coupling to the spark plug wire and generating a voltage signal representative of the voltage on the spark plug wire;

a plurality of light emitting diodes (LEDs) mounted to the housing, each LED corresponding to a selected voltage level;

an input circuit comprising an input coupled to the capacitive probe to receive the voltage signal, a measurement output and an absolute value circuit coupled between the input and the measurement output; and a measurement circuit coupled between the measurement output and the LEDs for selectively lighting the LEDs in response to the measurement output.

2. The hand-held ignition voltage tester of claim 1 wherein the plurality of LEDs are mounted to the housing in ascending order of the corresponding voltage levels to form a bar graph.

3. The hand-held ignition voltage tester of claim 2 and further comprising:

an open circuit indicator positioned at a high end of the bar graph and being operated by the measurement circuit to indicate an open circuit condition when the voltage signal exceeds a selected maximum voltage; and a short circuit indicator positioned at a low end of the bar graph and being operated by the measurement circuit to indicate a shorted condition when the voltage signal is below a selected minimum voltage.

4. The hand-held ignition voltage tester of claim 1 wherein:

the measurement circuit comprises a plurality of comparators, with each comparator having a first input coupled to the measurement output, a second input coupled to a respective reference voltage terminal, and an output coupled to a respective one of the plurality of LEDs.

5. The hand-held ignition voltage tester of claim 4 wherein the input circuit further comprises:

a variable gain amplifier coupled between the input of the input circuit and the absolute value circuit.

6. The hand-held ignition voltage tester of claim 4 wherein the absolute value circuit has an output and the input circuit further comprises:

a measurement capacitor coupled to the output of the absolute value circuit; and a discharge resistance coupled in parallel with the measurement capacitor.

7. The hand-held ignition voltage tester of claim 6 wherein the input circuit further comprises:

a peak store switch coupled in series with the discharge resistance for selectively disconnecting the discharge resistance from the measurement capacitance.

8. The hand-held ignition voltage tester of claim 4 wherein the absolute value circuit has an output and the input circuit further comprises:

a range amplifier having an input coupled to the output of the absolute value circuit and an output coupled to the first inputs of the plurality of comparators.

9. The hand-held ignition voltage tester of claim 8 wherein the range amplifier comprises:

an operational amplifier having an inverting input, a non-inverting input coupled to the output of the absolute value circuit, and an output coupled to the first inputs of the plurality of comparators;

a feedback resistor coupled between the inverting input and the output of the operational amplifier; and a range switch coupled in parallel with the feedback resistor.

10. The hand-held ignition voltage tester of claim 4 wherein the plurality of LEDs comprises a first LED corresponding to a selected minimum voltage level and wherein the measurement circuit further comprises:

a diode having an anode coupled to the output of the comparator that is coupled to the first LED and having a cathode;

a reference voltage generator;

an amplifier having a non-inverting input coupled to the reference voltage generator, an inverting input coupled to the cathode and an output; and a low voltage indicating LED coupled to the output of the amplifier.

11. The hand-held ignition voltage tester of claim 10 wherein the measurement circuit further comprises:

a time delay capacitor coupled to the cathode of the diode and having a capacitance;

a load resistor coupled in parallel with the time delay capacitor and having a resistance; and wherein the amplifier turns the low voltage indicating LED off when the first LED is on and turns the low voltage indicating LED on after the first LED has been off for a selected time determined by the capacitance of the time delay capacitor and the resistance of the load resistor.

12. The hand-held ignition voltage tester of claim 1 wherein the capacitive probe comprises:

a conductive probe handle;

a clamping member for clamping to the spark plug wire;

a first insulator attached to the clamping member which insulates the clamping member from the spark plug wire; and a shielded cable attached to the probe handle and comprising an inner conductor, a second insulator surrounding the inner conductor, a conductive shield surrounding the second insulator, and a third insulator surrounding the conductive shield, wherein the probe handle is grounded to the conductive shield and wherein the inner conductor extends along the clamping member between the clamping member and the first insulator and forms a capacitive pickup, with the conductive shield being stripped from the inner conductor along the clamping member only.

13. The hand-held ignition voltage tester of claim 12 and further comprising:

a ground terminal coupled to the negative power cable and to the conductive shield; and a voltage regulator coupled to the positive and negative power cables and having positive and negative supply terminals coupled to the measurement circuit.

14. A hand-held ignition voltage tester for detecting voltage on a spark plug wire in a distributorless ignition system, the tester comprising:

a housing;

a positive and negative power cables extending from the housing;

a capacitive probe extending from the housing for capacitively coupling to the spark plug wire and for generating a voltage signal representative of the voltage on the spark plug wire;

a plurality of voltage level indicators mounted to the housing to form a bar graph, each indicator corresponding to a selected voltage level;

an absolute value circuit having an input coupled to the capacitive probe for receiving the voltage signal and having a magnitude output; and measurement means coupled to the magnitude output and the plurality of voltage level indicators for activating each voltage level indicator for which the magnitude output exceeds the corresponding selected voltage level.

15. The hand-held ignition voltage tester of claim 14 and further comprising:
   a low voltage indicator; and
   wherein one of the selected voltage levels is a minimum voltage level and wherein the measurement means activates the low voltage indicator when the magnitude output is less than the minimum voltage level.

16. A capacitive probe for detecting peak voltage in a spark plug wire of an ignition system, the capacitive probe comprising:
   a conductive probe handle;
   a clamping member for clamping to the spark plug wire;
   a first insulator attached to the clamping member which insulates the clamping member from the spark plug wire; and
   a shielded cable attached to the probe handle and comprising an inner conductor, a second insulator surrounding the inner conductor, a conductive shield surrounding the second insulator, and a third insulator surrounding the conductive shield, wherein the probe handle is grounded to the conductive shield and wherein the inner conductor extends along the clamping member between the clamping member and the first insulator and forms a capacitive pick-up, with the conductive shield being stripped from the inner conductor along the clamping member only.

17. The capacitive probe of claim 16 wherein the clamping member comprises a metallic, spring-loaded clamp.

18. The capacitive probe of claim 16 wherein the conductive probe handle and the clamping member form an alligator-type clamp having a pair of spring-loaded clamping teeth which are separated by a pivot.

19. The capacitive probe of claim 16 wherein the probe handle has a connector which is crimped to the shielded cable and a portion of the third insulator is stripped from the conductive shield at the connector such that the conductive shield is electrically coupled to the probe handle through the connector.

* * * * *